US012366539B2

United States Patent
Kimura et al.

(10) Patent No.: US 12,366,539 B2
(45) Date of Patent: Jul. 22, 2025

(54) SURFACE INSPECTION DEVICE

(71) Applicant: Hitachi High-Tech Corporation, Tokyo (JP)

(72) Inventors: Katsuhiko Kimura, Tokyo (JP); Yoshihiro Satou, Tokyo (JP); Masaya Yamamoto, Tokyo (JP); Ayumi Tomiyama, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 114 days.

(21) Appl. No.: 18/285,295

(22) PCT Filed: Apr. 14, 2021

(86) PCT No.: PCT/JP2021/015471
§ 371 (c)(1),
(2) Date: Oct. 2, 2023

(87) PCT Pub. No.: WO2022/219748
PCT Pub. Date: Oct. 20, 2022

(65) Prior Publication Data
US 2024/0118223 A1   Apr. 11, 2024

(51) Int. Cl.
*G01N 21/95* (2006.01)
(52) U.S. Cl.
CPC .............. *G01N 21/9501* (2013.01); *G01N 2201/025* (2013.01)
(58) Field of Classification Search
CPC .......... G01N 21/9501; G01N 2201/025; H01L 21/68; H01L 22/00

(Continued)

(56) References Cited

U.S. PATENT DOCUMENTS

2007/0211241 A1    9/2007  Aizawa et al.
2008/0178204 A1*   7/2008  Kuramoto .............. G11B 17/03
(Continued)

FOREIGN PATENT DOCUMENTS

JP    2002-323584 A    11/2002
JP    2007-225480 A    9/2007
(Continued)

OTHER PUBLICATIONS

International Search Report (PCT/ISA/210) issued in PCT Application No. PCT/JP2021/015471 dated Jul. 20, 2021 with English translation (4 pages).

(Continued)

*Primary Examiner* — Seung C Sohn
(74) *Attorney, Agent, or Firm* — Crowell & Moring LLP

(57) ABSTRACT

A surface inspection device (1) according to the present invention comprises: a plate-shaped sample holding member (3) which can hold a sample (2); a spindle motor (4) for rotating the sample holding member (3); a turntable (5) which is fixed to the spindle motor (4) and rotated by the spindle motor (4); a frame (6) to which the spindle motor (4) is fixed; a plurality of support members (12) each having one end fixed to the sample holding member (3) and the other end fixed to the turntable (5), the support members supporting the sample holding member (3) such that the sample holding member is displaceable in a focus direction which is the height direction with respect to the turntable (5); and a sample drive unit (11) which displaces the sample holding member (3) in the focus direction with respect to the turntable (5). This surface inspection device (1) can accurately drive the sample (2) in the focus direction.

13 Claims, 14 Drawing Sheets

(58) Field of Classification Search
USPC .......................................... 356/237.1–237.5
See application file for complete search history.

(56) References Cited

U.S. PATENT DOCUMENTS

2009/0058446 A1* 3/2009 Yamamoto ......... G01R 31/2891
324/750.28
2013/0033123 A1  2/2013 Kubota et al.

FOREIGN PATENT DOCUMENTS

JP   2011-119320 A   6/2011
WO   WO 2011/125260 A1   10/2011

OTHER PUBLICATIONS

Japanese-language Written Opinion (PCT/ISA/237) issued in PCT Application No. PCT/JP2021/015471 dated Jul. 20, 2021 with English translation (5 pages).

* cited by examiner

[FIG. 1]
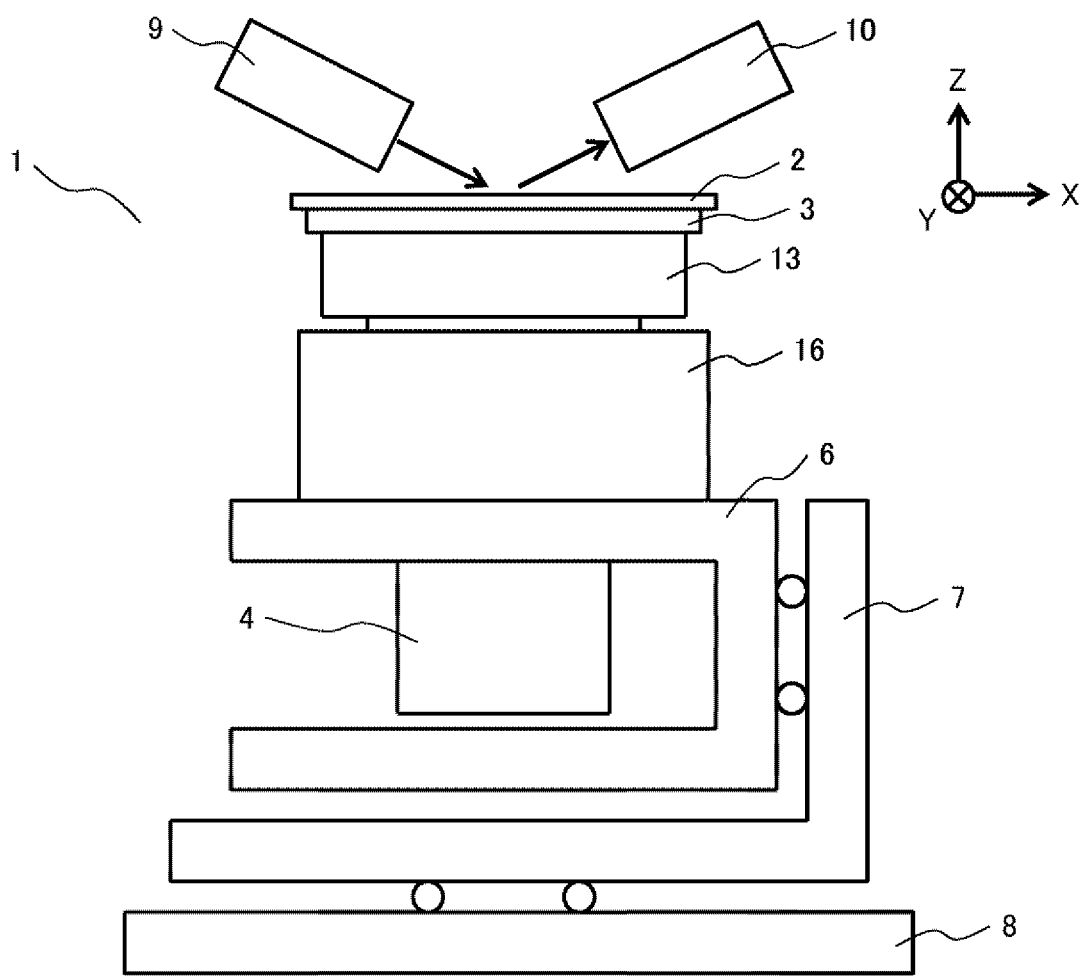

[FIG. 2]
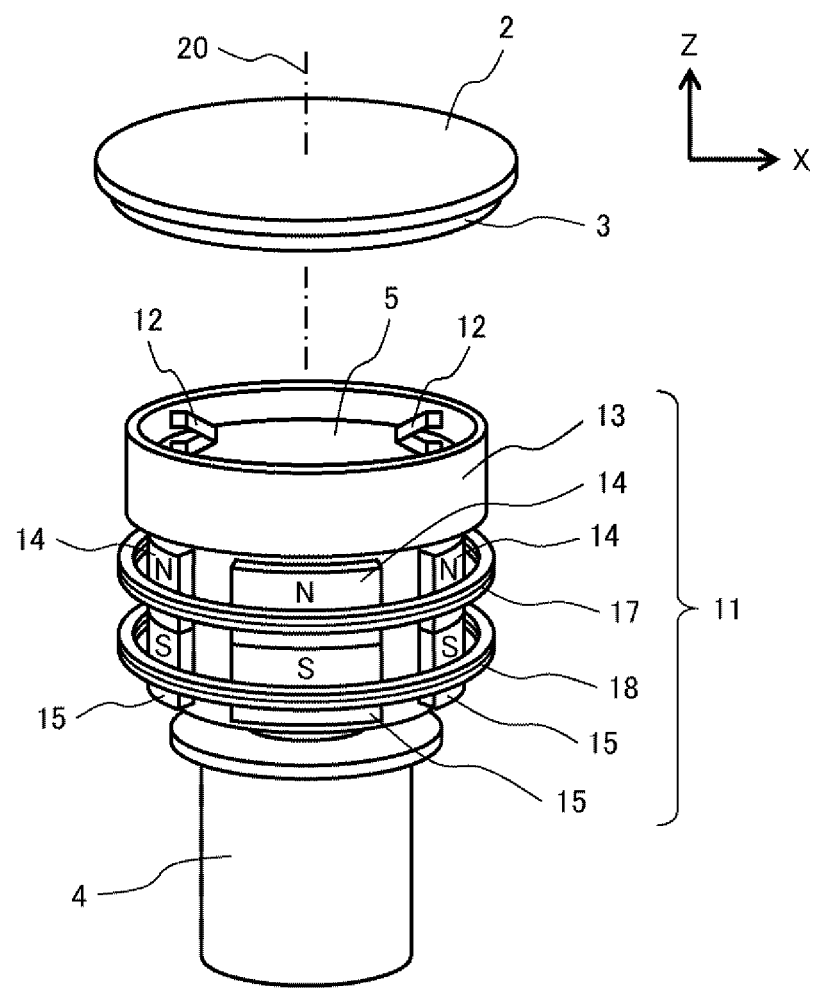

[FIG. 3]
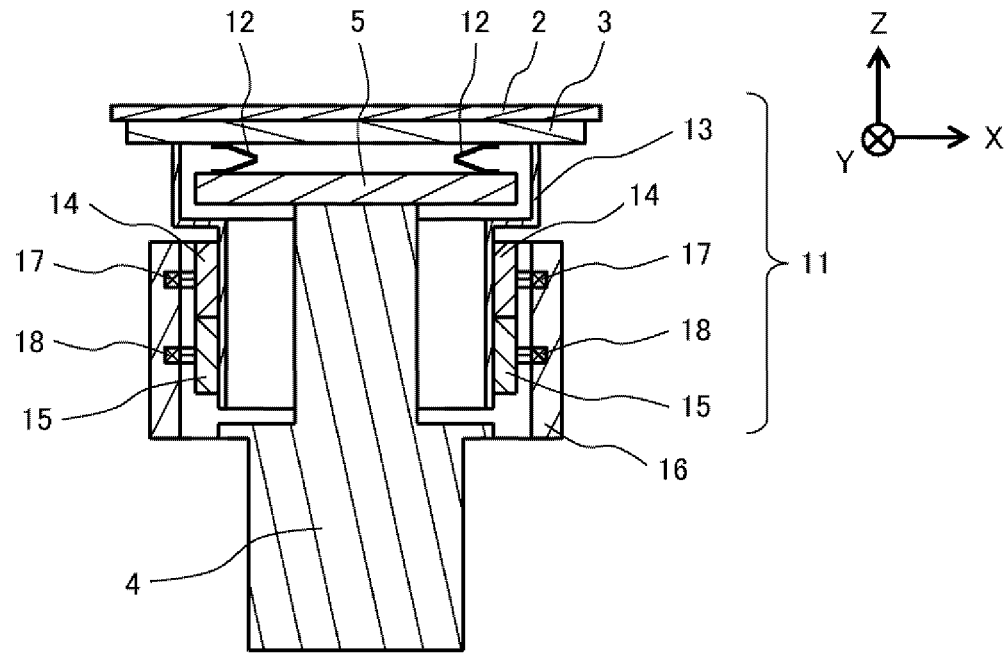
[FIG. 4]
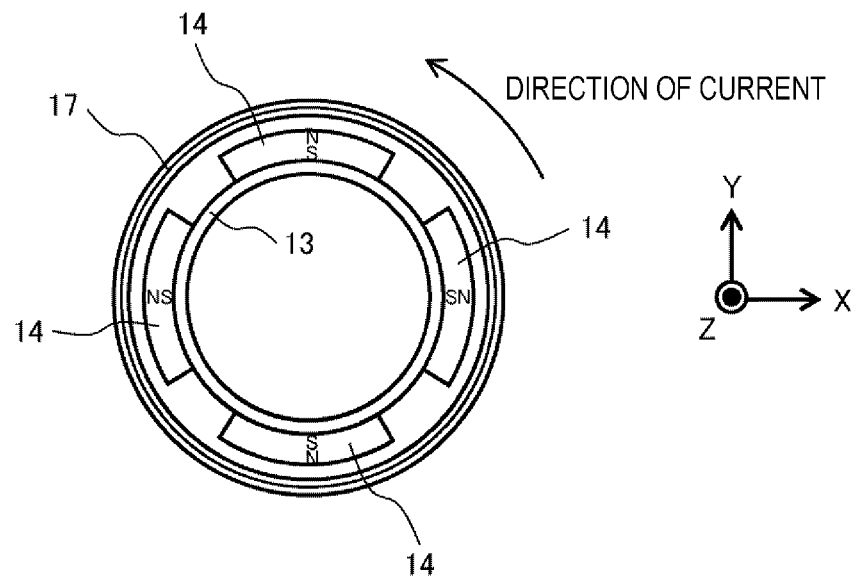
DIRECTION OF CURRENT

[FIG. 5]
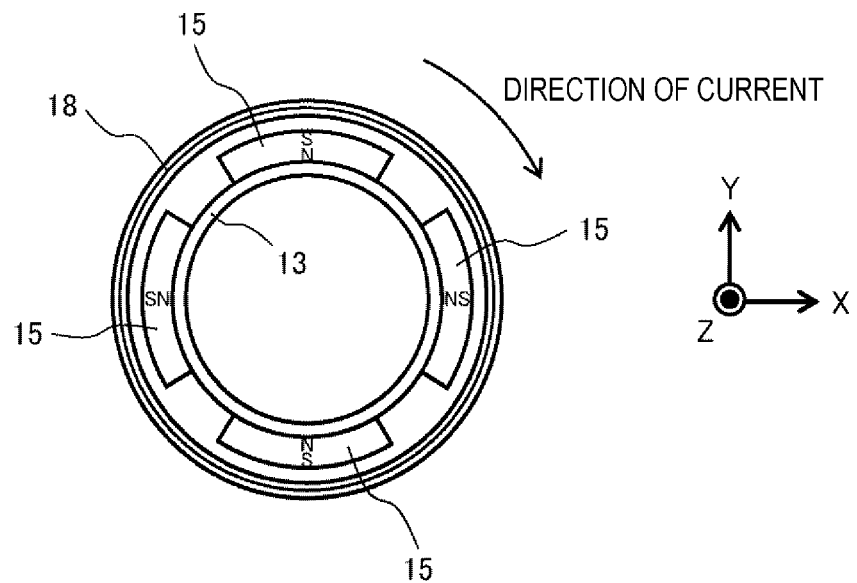
[FIG. 6]
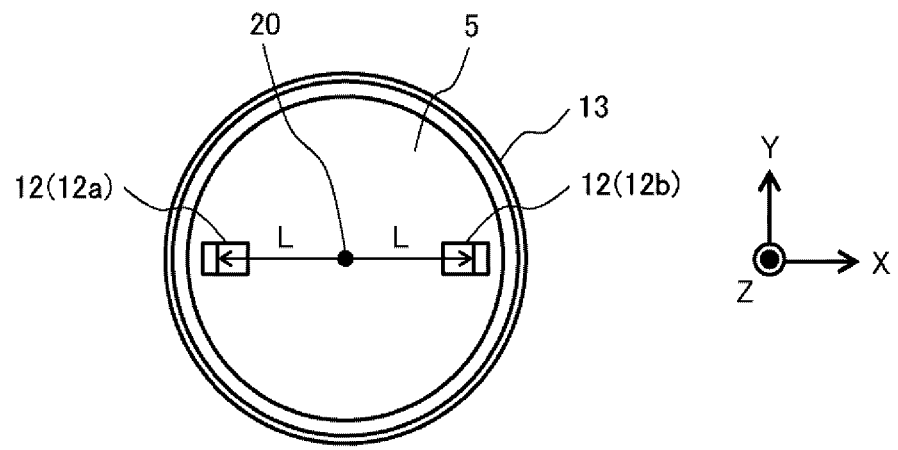

[FIG. 7A]
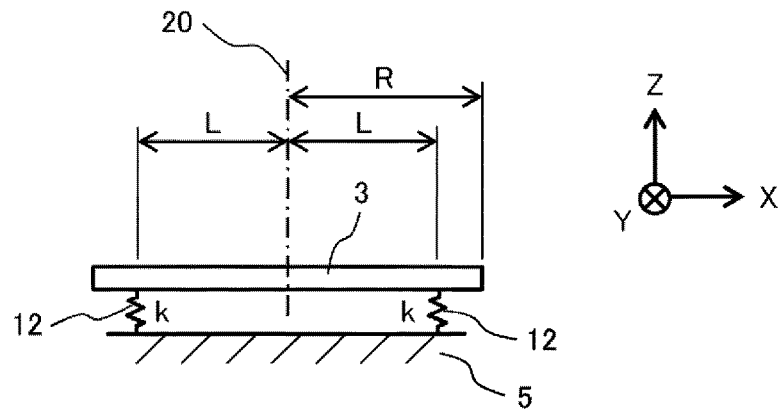
[FIG. 7B]
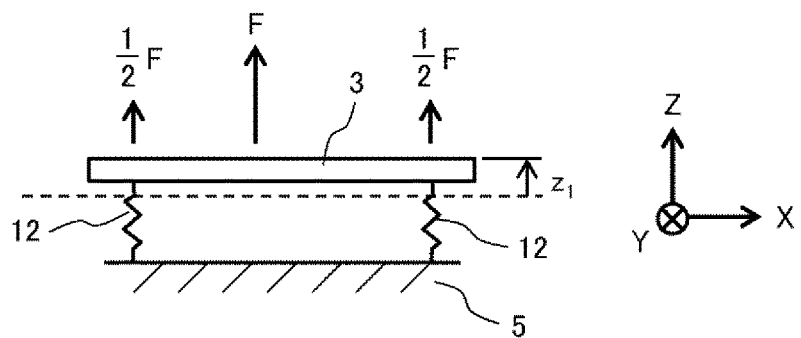
[FIG. 7C]
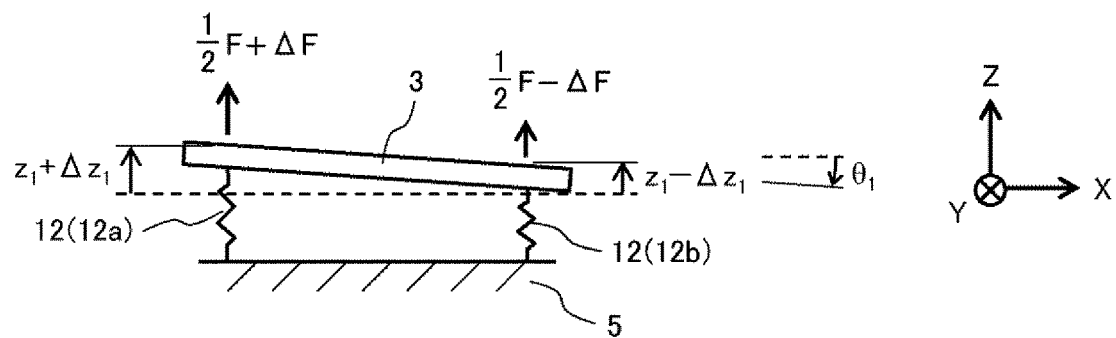

[FIG. 8]
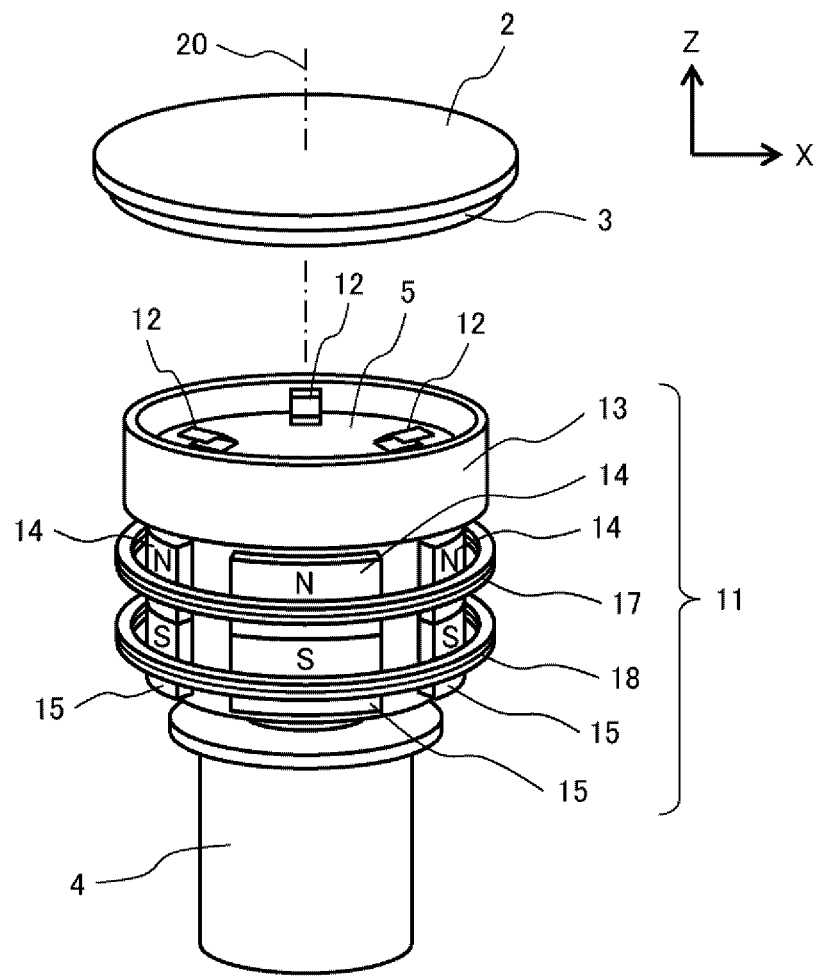
[FIG. 9]
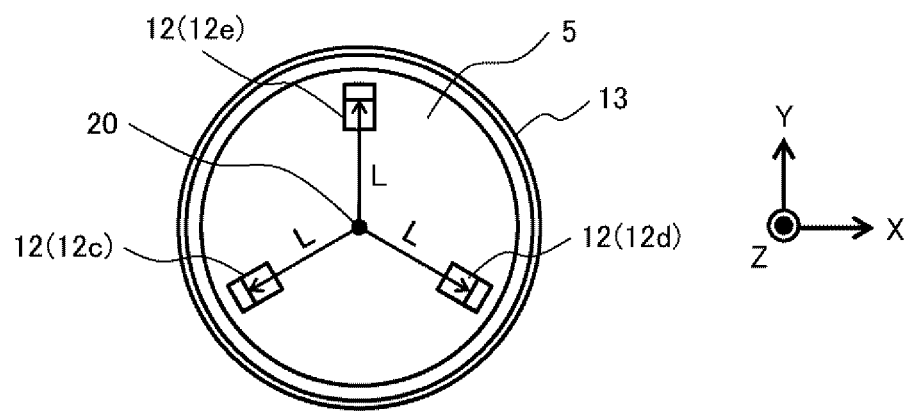

[FIG. 10A]
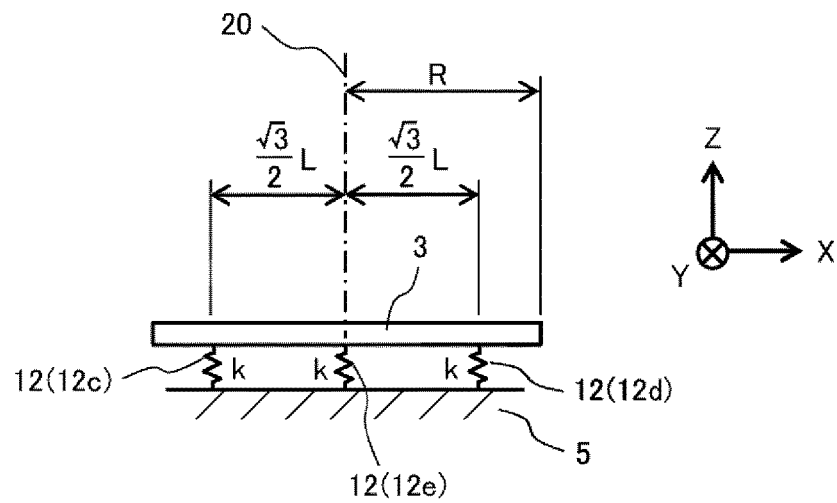
[FIG. 10B]
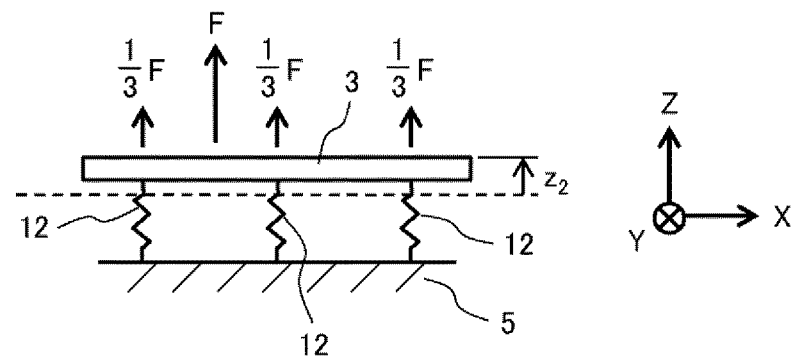
[FIG. 10C]
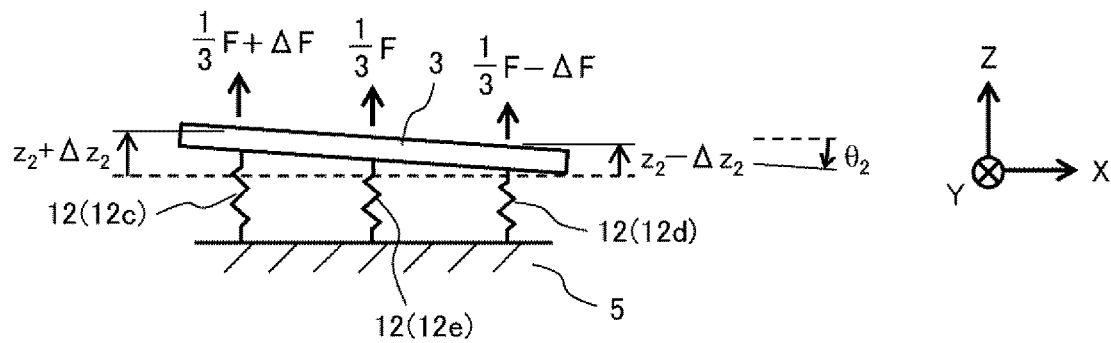

[FIG. 11]
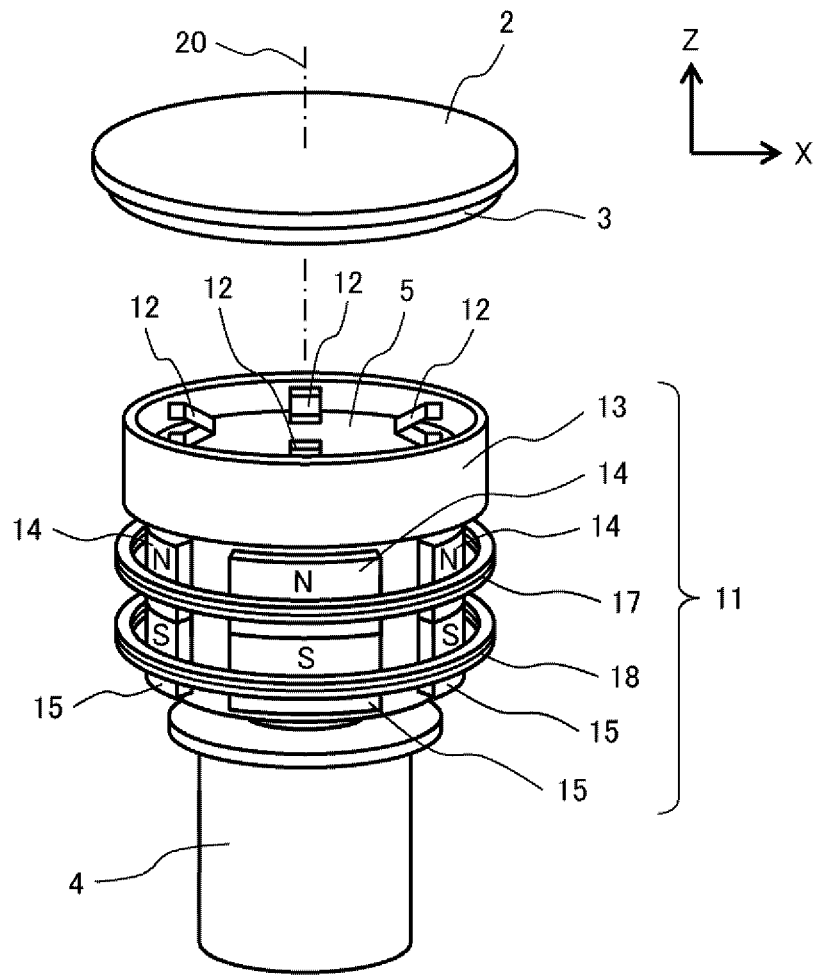
[FIG. 12]
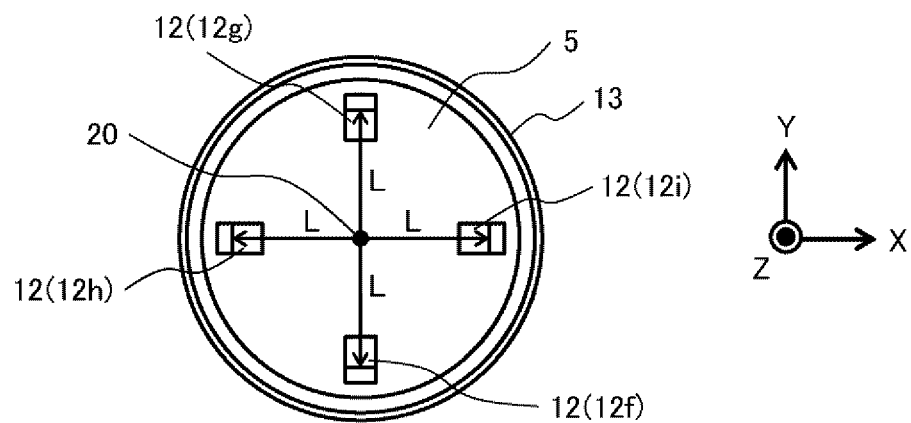

[FIG. 13A]
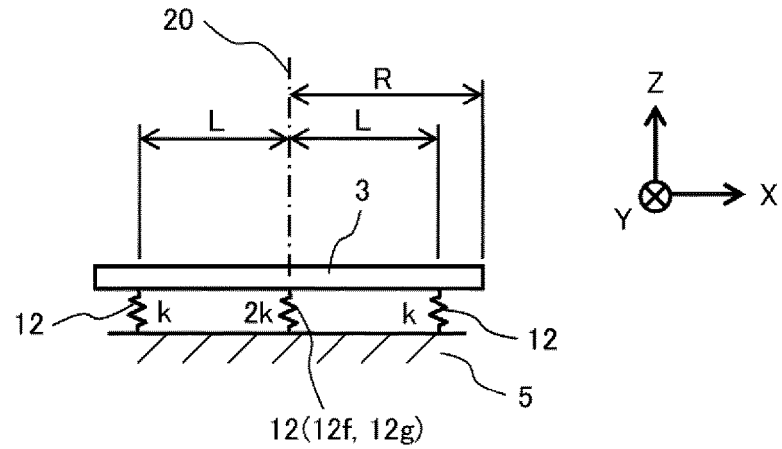
[FIG. 13B]
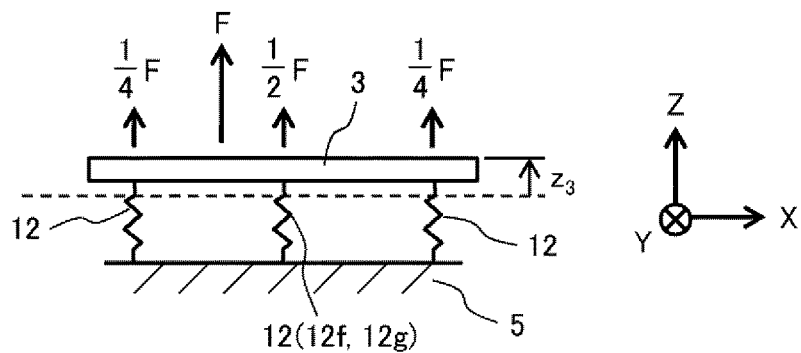
[FIG. 13C]
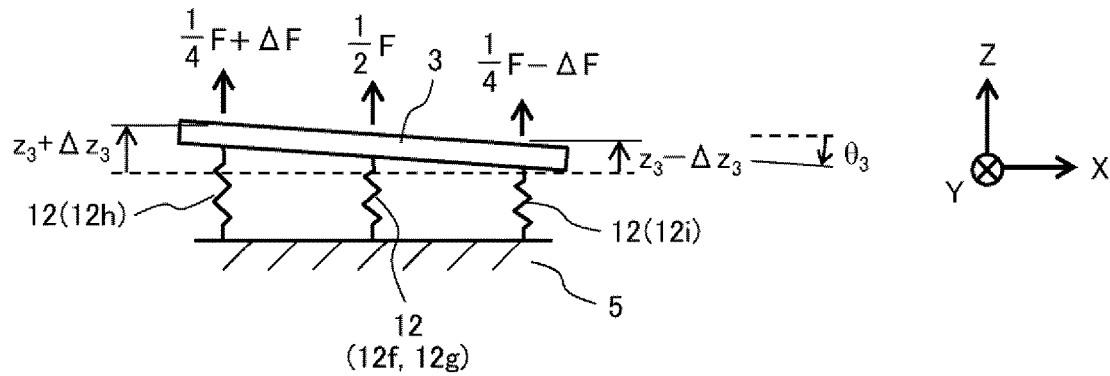

[FIG. 14]
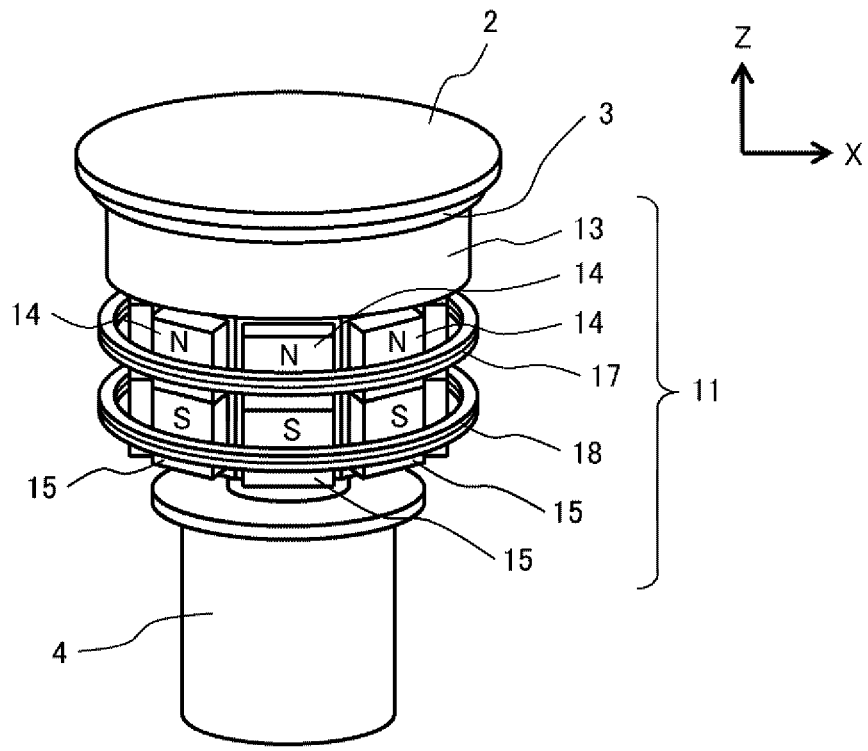
[FIG. 15]
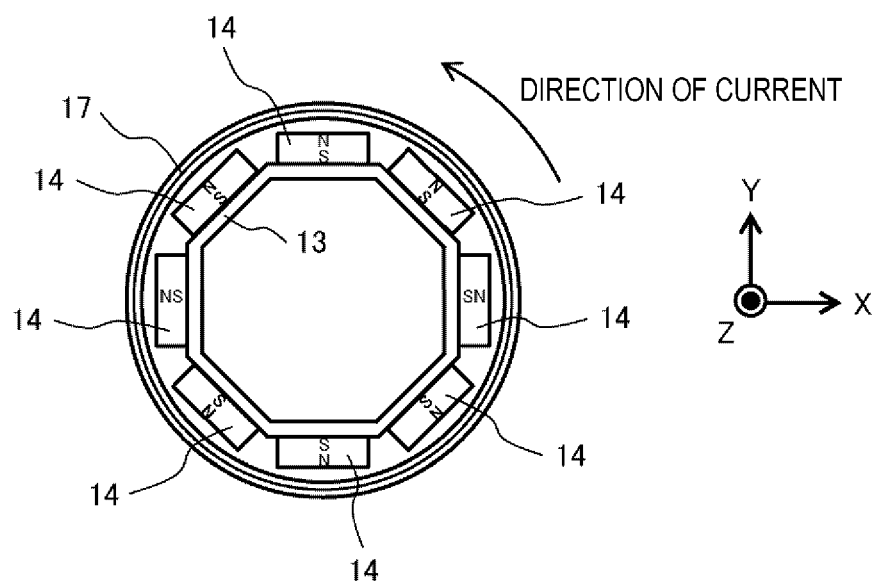

[FIG. 16]
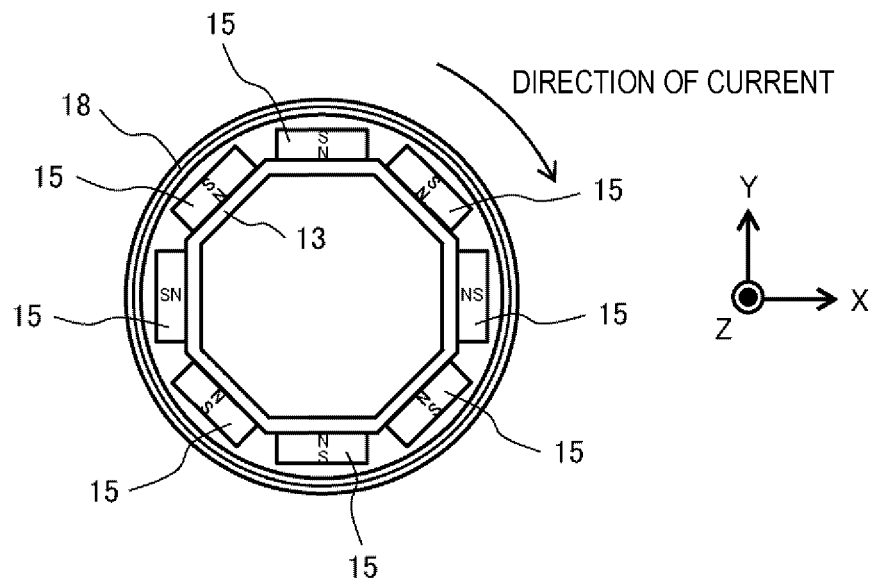
[FIG. 17]
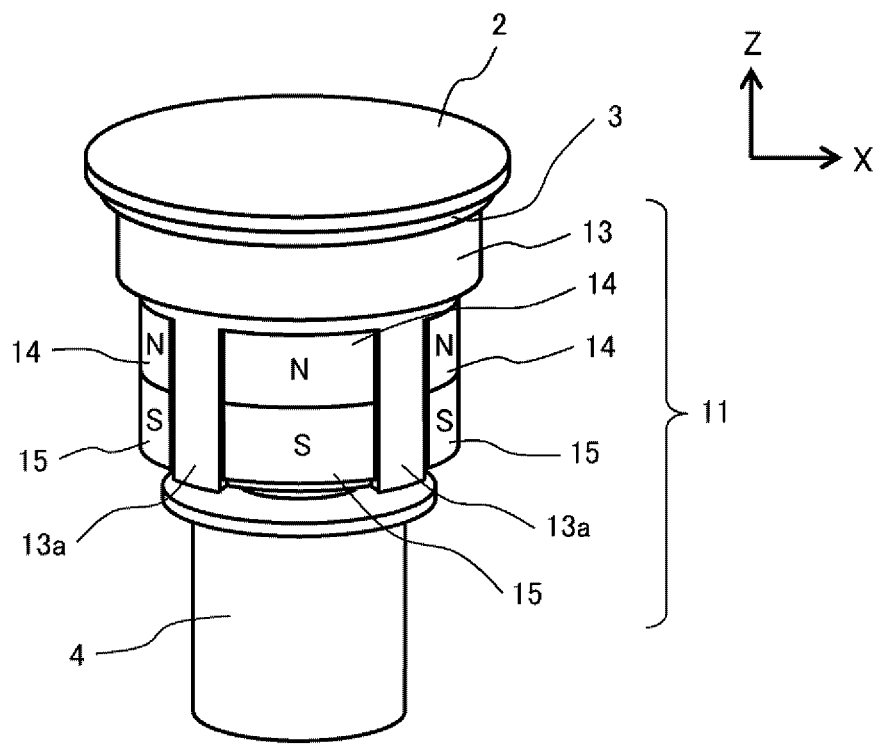

[FIG. 18]
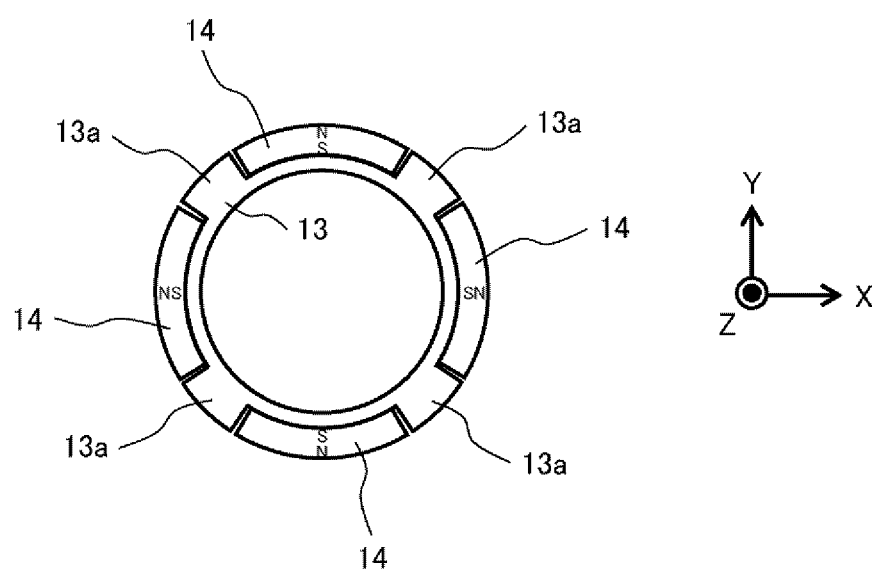

[FIG. 19]
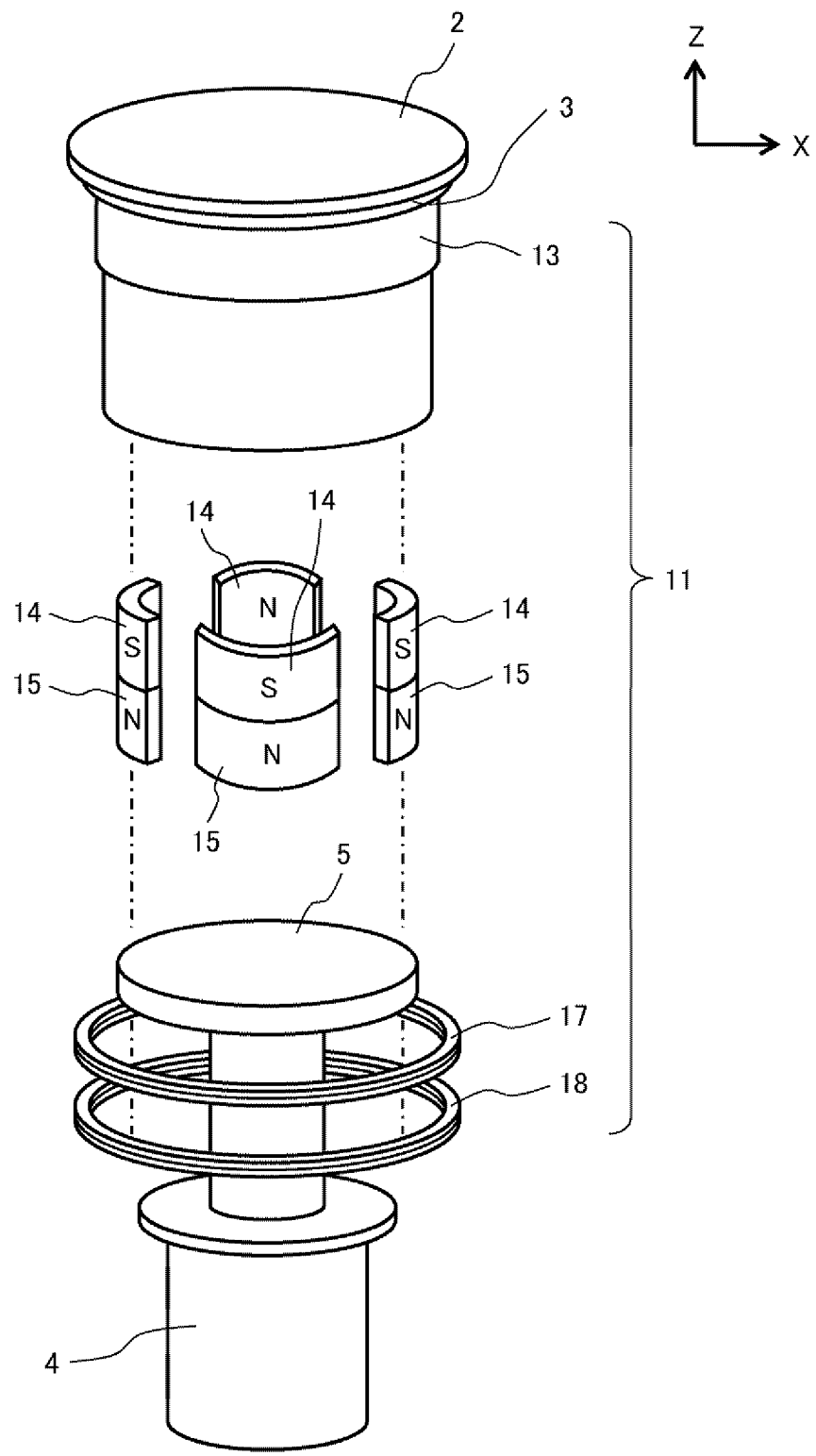

[FIG. 20]
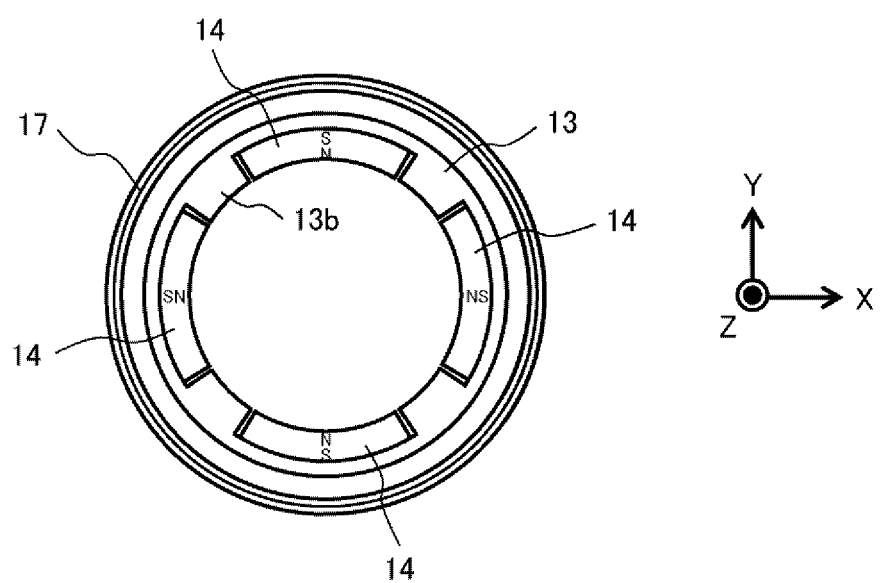

SURFACE INSPECTION DEVICE

TECHNICAL FIELD

The present invention relates to a surface inspection device inspecting a sample such as a wafer.

BACKGROUND ART

In manufacturing processes of semiconductor devices, surface inspection devices inspecting whether there are foreign substances attached to the surfaces of samples such as wafers or whether there are defects on the surfaces of the samples. The surface inspection devices irradiate the surfaces of the rotating samples having a circular plate shape with laser light to inspect the entire surfaces of the samples by moving the samples in radial directions. When there are foreign substances or defects on the surfaces of the samples, the laser light with which the samples are irradiated is scattered. The surface inspection devices detect foreign substances or defects by receiving the scattered light by detection optical systems and specify positions of the foreign substances or the defects on the samples from positions in the radial directions or rotational angles of the samples.

As semiconductor devices are miniaturized, an improvement in detection sensitivity of foreign substances or defects is required for surface inspection devices. As a method of improving detection sensitivity, shortening of a wavelength of laser light is in progress. When the wavelength of the laser light is shortened, depth of focus of an optical system becomes shallow. Therefore, when a height position of the surface of a sample which is being inspected varies, a position of the surface of the sample is out of an allowable focal range of an optical system. Thus, there is concern of deterioration in detection sensitivity or deviation in a detection position occurring.

To solve this problem, an example in which a device capable of driving a sample in a perpendicular direction (vertical direction) to the surface of the sample is disclosed in PTL 1. A drive device disclosed in PTL 1 can drive a stage in the vertical direction (z direction) and a rotational direction (Oz direction) in which the vertical direction is a central axis. The stage is driven in the Z direction by an actuator that includes a rotor including a plurality of permanent magnets and a stator including a coil for driving the stage in the Z direction.

CITATION LIST

Patent Literature

PTL 1: WO2011/125260A

SUMMARY OF INVENTION

Technical Problem

In surface inspection devices of the related art, in a case where driving is performed in the vertical direction (focus direction) while rotating a sample, when the sample is sloped and the surface of the sample is not perpendicular to the focus direction, a height position (a position in the focus direction) of the surface of the sample changes according to a position in a radial direction of the sample. Then, the height position of the surface of the sample varies and is out of an allowable focal range of an optical system and thus accurate inspection cannot be performed. Therefore, in order to accurately inspect a sample, it is necessary to accurately drive the sample in the focus direction while inhibiting a slope of the sample to be small and determine a position of the sample accurately. In the related art such as a technique disclosed in PTL1, it is difficult to accurately drive the sample in the focus direction so as to cope with the variation in the height direction of the sample.

An object of the present invention is to provide a surface inspection device capable of driving a sample in a focus direction (height direction) accurately.

Solution to Problem

According to an aspect of the present invention, a surface inspection device includes: a plate-shaped sample holding member capable of holding a sample; a spindle motor configured to rotate the sample holding member; a turntable fixed to the spindle motor and configured to rotate by an operation of the spindle motor; a frame to which the spindle motor is fixed; a plurality of support members each having one end fixed to the sample holding member and the other end fixed to the turntable, the support members configured to support the sample holding member such that the sample holding member is displaceable in a focus direction that is a height direction with respect to the turntable; and a sample drive unit configured to displace the sample holding member in the focus direction with respect to the turntable.

Advantageous Effects of Invention

According to the invention, it is possible to provide a surface inspection device capable of driving a sample in a focus direction (height direction) accurately.

BRIEF DESCRIPTION OF DRAWINGS

FIG. 1 is a diagram illustrating a configuration of a surface inspection device according to a first embodiment of the present invention.

FIG. 2 is a diagram illustrating a sample drive unit and support members of the surface inspection device according to the first embodiment.

FIG. 3 is a sectional view illustrating the sample drive unit and the support members of the surface inspection device on an XZ plane according to the first embodiment.

FIG. 4 is a diagram illustrating arrangement of first magnets and a first coil provided in a yoke according to the first embodiment.

FIG. 5 is a diagram illustrating arrangement of second magnets and a second coil provided in the yoke according to the first embodiment.

FIG. 6 is a top view illustrating arrangement of support members in a sample holding member and a turntable according to the first embodiment.

FIG. 7A is a schematic view illustrating deformation of a support member when the sample holding member is driven in a focus direction and a diagram illustrating a state in which the sample holding member is not displaced according to the first embodiment.

FIG. 7B is a schematic view illustrating deformation of a support member when the sample holding member is driven in the focus direction and a diagram illustrating a state in which the sample holding member is displaced in the focus direction without being sloped with respect to a surface perpendicular to the focus direction according to the first embodiment.

FIG. 7C is a schematic view illustrating deformation of a support member when the sample holding member is driven in the focus direction and a diagram illustrating a state in which the sample holding member is sloped with respect to the surface perpendicular to the focus direction and is displaced in the focus direction according to the first embodiment.

FIG. 8 is a diagram illustrating a sample drive unit and a support member of a surface inspection device according to a second embodiment of the present invention.

FIG. 9 is a top view illustrating arrangement of the support member in a sample holding member and a turntable according to the second embodiment.

FIG. 10A is a schematic view illustrating deformation of the support member when the sample holding member is driven in a focus direction and a diagram illustrating a state in which the sample holding member is not displaced according to the second embodiment.

FIG. 10B is a schematic view illustrating deformation of the support member when the sample holding member is driven in the focus direction and a diagram illustrating a state in which the sample holding member is displaced in the focus direction without being sloped with respect to a surface perpendicular to the focus direction according to the second embodiment.

FIG. 10C is a schematic view illustrating deformation of the support member when the sample holding member is driven in the focus direction and a diagram illustrating a state in which the sample holding member is sloped with respect to the surface perpendicular to the focus direction and is displaced in the focus direction according to the second embodiment.

FIG. 11 is a diagram illustrating a sample drive unit and a support member of a surface inspection device according to a third embodiment of the present invention.

FIG. 12 is a top view illustrating arrangement of the support member in a sample holding member and a turntable according to the third embodiment.

FIG. 13A is a schematic view illustrating deformation of the support member when the sample holding member is driven in a focus direction and a diagram illustrating a state in which the sample holding member is not displaced according to the third embodiment.

FIG. 13B is a schematic view illustrating deformation of the support member when the sample holding member is driven in the focus direction and a diagram illustrating a state in which the sample holding member is displaced in the focus direction without being sloped with respect to a surface perpendicular to the focus direction according to the third embodiment.

FIG. 13C is a schematic view illustrating deformation of the support member when the sample holding member is driven in the focus direction and a diagram illustrating a state in which the sample holding member is sloped with respect to the surface perpendicular to the focus direction and is displaced in the focus direction according to the third embodiment.

FIG. 14 is a diagram illustrating a sample drive unit of a surface inspection device according to a fourth embodiment of the present invention.

FIG. 15 is a diagram illustrating arrangement of first magnets and a first coil provided in a yoke according to the fourth embodiment.

FIG. 16 is a diagram illustrating arrangement of second magnets and a second coil provided in a yoke according to the fourth embodiment.

FIG. 17 is a diagram illustrating a sample drive unit of a surface inspection device according to a fifth embodiment of the present invention.

FIG. 18 is a diagram illustrating an arrangement of the first magnets provided in the yoke according to the fifth embodiment.

FIG. 19 is an exploded perspective view illustrating a configuration of a sample drive unit of a surface inspection device according to a sixth embodiment of the present invention.

FIG. 20 is a diagram illustrating an arrangement of the first magnets provided in the yoke according to the sixth embodiment.

DESCRIPTION OF EMBODIMENTS

A surface inspection device according to the present invention can inhibit a slope of a sample to be small in a state in which the sample is rotated and can drive the sample at a high speed accurately in a focus direction (a height direction or a vertical direction). Therefore, the surface inspection device according to the present invention can cause a position of the surface of the sample to be within an allowable focal range of an optical system and can accurately inspect the sample.

Hereinafter, the surface inspection device according to embodiments of the present invention will be described with reference to the drawings. In the drawings used in the present specification, the same or corresponding components are denoted by the same reference numerals and repeated description of these components will be omitted in some cases.

First Embodiment

FIG. 1 is a diagram illustrating a configuration of a surface inspection device 1 according to a first embodiment of the present invention. The surface inspection device 1 includes a sample holding member 3, a spindle motor 4, a frame 6, a vertical drive stage 7, a horizontal drive stage 8, an illumination optical system 9, a detection optical system 10, a yoke 13, and a coil fixing member 16.

The sample holding member 3 has a plate shape (for example, a circular plate shape) and can hold the sample 2. The sample 2 is, for example, a circular plate-shaped wafer. Hereinafter, it is assumed that the sample holding member 3 has a circular plate shape and the sample 2 has a circular plate shape in description.

In FIG. 1, a height direction of the surface inspection device 1 (a vertical direction of FIG. 1) is referred to as a focus direction or the Z direction and two directions (horizontal directions) perpendicular to the focus direction are referred to as an X direction and a Y direction. Imaginary axes parallel to the X, Y, and Z directions are referred to as X, Y, and Z axes.

The spindle motor 4 is a motor that rotates the sample 2 and the sample holding member 3 about the Z axis.

The spindle motor 4 is fixed to the frame 6.

The vertical drive stage 7 moves the frame 6 in the focus direction (the Z direction) so that the position of the surface of the sample 2 is within a predetermined height range. The vertical drive stage 7 moves the sample 2 and the sample holding member 3 in the focus direction by moving the frame 6.

The horizontal drive stage 8 moves the vertical drive stage 7 and the frame 6 in a radial direction (the X direction in FIG. 1) of the sample holding member 3. The horizontal drive stage 8 moves the sample holding member 3 and the sample 2 in the radial direction of the sample holding member 3 by moving the vertical drive stage 7 and the frame 6.

The illumination optical system 9 irradiates the surface of the sample 2 with laser light. The laser light with which the surface of the sample 2 is irradiated is scattered by a foreign substance or a defect on the surface of the sample 2 to become scattered light.

The detection optical system 10 receives the scattered light occurring on the surface of the sample 2. A processing device (not illustrated) is connected to the detection optical system 10. The processing device detects whether there is a foreign substance or a defect on the surface of the sample 2 from a signal of the scattered light received by the detection optical system 10 and specifies a position of the foreign substance or the defect from a rotational angle and a radial direction (the X direction) of the sample holding member 3.

The coil fixing member 16 is fixed to the frame 6.

The yoke 13 is a cylindrical member. The yoke 13 will be described below.

The surface inspection device 1 according to the embodiment further includes a turntable. The turntable will be described below.

The surface inspection device 1 scans the entire surface of the sample 2 with the laser light from the illumination optical system 9 by moving the sample holding member 3 in the radial direction (the X direction) of the sample holding member 3 by the horizontal drive stage 8 while rotating the sample holding member 3 about the Z axis by the spindle motor 4.

The vertical drive stage 7 is a mechanism that adjust an average height position (a position in the focus direction) of the surface of the sample 2. A speed at which the vertical drive stage 7 moves the frame 6 in the focus direction, that is, a speed at which the sample holding member 3 is moved in the focus direction by the vertical drive stage 7, is lower than a speed of rotation (rotational frequency) of the sample holding member 3 by the spindle motor 4.

In order to inspect the sample 2 with high accuracy, it is required to follow a variation in a position of the sample holding member 3 in the focus direction during rotation of the sample holding member 3 holding the sample 2, and adjust a height position of the sample holding member 3 (that is, the surface of the sample 2).

The surface inspection device 1 according to the embodiment includes a sample drive unit that is capable of adjusting a height position of the sample holding member 3 (the surface of the sample 2) with respect to the variation in the position in the focus direction during rotation of the sample holding member 3, and a plurality of support members that support the sample holding member 3 so that the sample holding member 3 can be displaced in the focus direction.

FIG. 2 is a diagram illustrating a sample drive unit 11, the plurality of support members 12, and peripheral constituent members (the sample holding member 3 holding the sample 2 and the spindle motor 4) of the surface inspection device 1 according to the embodiment. In FIG. 2, in order to facilitate the description, the frame 6, the vertical drive stage 7, the horizontal drive stage 8, and the coil fixing member 16 are not illustrated and the sample holding member 3 is illustrated to be separated from the sample drive unit 11.

In FIG. 2, a central axis 20 of the sample holding member 3 is illustrated. The central axis 20 of the sample holding member 3 is parallel to the focus direction (the Z direction). The sample holding member 3 is rotated about the central axis 20 by an operation of the spindle motor 4.

The surface inspection device 1 includes a turntable 5 provided in the spindle motor 4. The turntable 5 is fixed to one end of the spindle motor 4 and is rotated about the Z axis by the operation of the spindle motor 4 such that the sample 2 and the sample holding member 3 are rotated about the Z axis. The turntable 5 is located inside the cylindrical yoke 13.

FIG. 3 is a sectional view illustrating the sample drive unit 11, the plurality of support members 12, and the peripheral constituent members on an XZ plane. In FIG. 3, the frame 6, the vertical drive stage 7, and the horizontal drive stage 8 are not illustrated.

The sample drive unit 11 and the support members 12 will be described with reference to FIGS. 2 and 3.

The sample drive unit 11 includes the yoke 13, a plurality of first magnets 14, a plurality of second magnets 15, a first coil 17, and a second coil 18. The sample drive unit 11 can displace the sample holding member 3 in the focus direction (the Z direction) with respect to the turntable 5.

The yoke 13 includes a cylindrical portion that has the focus direction (the Z direction) as a central axis and the sample holding member 3 is fixed above. FIGS. 2 and 3 illustrate, for example, the yoke 13 including two cylindrical portions with different lengths of the sample holding member 3 in the radial direction.

The plurality of first magnets 14 are provided at a first height position in the focus direction on the outer surface of the cylindrical portions of the yoke 13. The plurality of first magnets 14 are fixed to the surface of the yoke 13 at any intervals in the circumferential direction of the yoke 13.

The plurality of second magnets 15 are provided at a second height position in the focus direction on the outer surface of the cylindrical portions of the yoke 13. The plurality of second magnets 15 are fixed to the surface of the yoke 13 at any intervals in the circumferential direction of the yoke 13. The second height position is a position different from the first height position in the focus direction (the height direction).

The number of the plurality of first magnets 14 is preferably the same as the number of the plurality of second magnets 15.

The first coil 17 has an annular shape, is fixed to the coil fixing member 16 (FIG. 3), and is disposed around the first magnets 14.

The second coil 18 has an annular shape, is fixed to the coil fixing member 16, and is disposed around the second magnets 15.

The plurality of support members 12 is provided between the sample holding member 3 and the turntable 5. Each of the support members 12 has one end fixed to the sample holding member 3 and the other end fixed to the turntable 5. The plurality of support members 12 are members that support the sample 2 and the sample holding member 3 so that the sample 2 and the sample holding member 3 can be displaced in the focus direction (the Z direction) with respect to the turntable 5 and are members that inhibit slopes of the sample holding member 3 and the sample 2. The support members 12 can be configured with, for example, elastic members such as springs. The support members 12 configured with the elastic members have excellent linearity of an operation and a frictional force is not used, and therefore there is an advantage that abrasion is small.

FIGS. 2 and 3 illustrate the support members 12 that each have a bending portion at one location, but any shape of the support member 12 can be determined. For example, the support members 12 may have a shape with a plurality of bending portions or may have a curved shape.

As illustrated in FIGS. 1 to 3, the spindle motor 4 is fixed to the turntable 5, the turntable 5 is fixed to the support members 12, and the support members 12 are fixed to the sample holding member 3. Therefore, when the spindle motor 4 is rotated, the turntable 5 is rotated about the Z axis and the sample holding member 3 is rotated about the Z axis with the rotation of the turntable 5 via the support members 12. The sample 2 held by the sample holding member 3 is rotated about the Z axis in this way by an operation of the spindle motor 4.

FIG. 4 is a diagram illustrating arrangement of the first magnets 14 and the first coil 17 provided in the yoke 13. FIG. 4 illustrates a cross-section (the XY plane) of the sample drive unit 11 perpendicular to the focus direction at the height position at which the first magnets 14 are provided (a first height position in the focus direction).

FIG. 5 is a diagram illustrating disposition of the second magnets 15 and the second coil 18 provided in the yoke 13. FIG. 5 illustrates a cross-section (the XY plane) of the sample drive unit 11 perpendicular to the focus direction at the height position at which the second magnets 15 are provided (a second height position in the focus direction).

The first magnets 14 and the second magnets 15 have an arc shape when viewed in the focus direction (the Z direction) and are provided on the outer surface of the cylindrical portion of the yoke 13.

The first magnets 14 are magnetized in the radial direction of the sample holding member 3, have a first polarity (the N pole in the embodiment) on a surface opposite to a surface coming into contact with the yoke 13, and have a second polarity (the S pole in the embodiment) on the surface coming into contact with the yoke 13.

The second magnets 15 are magnetized in the radial direction of the sample holding member 3, have the second polarity (the S pole in the embodiment) on a surface opposite to a surface coming into contact with the yoke 13, and have the first polarity (the N pole in the embodiment) on the surface coming into contact with the yoke 13. That is, the second magnets 15 have a polarity direction opposite to that of the first magnets 14.

When the sample drive unit 11 displaces the sample holding member 3 in the focus direction, a current flows in the first coil 17 in a direction opposite to a current flowing in the second coil 18 when viewed in the focus direction (the Z direction).

As illustrated in FIG. 4, if a current flows in the first coil 17 counterclockwise when viewed from the upper side in the focus direction, a downward force in the focus direction (the negative Z direction) is applied to the first coil 17 by interaction with a magnetic field from the first magnets 14 and an upward force in the focus direction (the positive Z direction) is applied to the first magnets 14.

As illustrated in FIG. 5, if a current flows in the second coil 18 clockwise when viewed from the upper side in the focus direction, a downward force in the focus direction (the negative Z direction) is applied to the second coil 18 by interaction with a magnetic field from the second magnets 15 and an upward force in the focus direction (the positive Z direction) is applied to the second magnets 15.

The first magnets 14 and the second magnets 15 are displaced in the upward focus direction by force acting on the first magnets 14 and the second magnets 15. With the displacement of the first magnets 14 and the second magnets 15, the yoke 13 and the sample holding member 3 are also displaced in the upward focus direction.

On the other hand, the first coil 17 and the second coil 18 are fixed to the spindle motor 4 via the coil fixing member 16 and the frame 6, and the spindle motor 4 is fixed to the turntable 5. Therefore, the turntable 5 is not displaced in the focus direction even when the sample holding member 3 is displaced in the focus direction.

That is, the first magnets 14, the second magnets 15, the yoke 13, and the sample holding member 3 are movable units that displace in the focus direction. The first coil 17, the second coil 18, and the turntable 5 are fixed units that do not displace in the focus direction.

Accordingly, when the sample holding member 3 is displaced in the upward focus direction, the turntable 5 is not displaced. Therefore, the support members 12, both ends of which are fixed to the sample holding member 3 and the turntable 5, extend in the focus direction. When the directions of the currents flowing in the first coil 17 and the second coil 18 are opposite to the forgoing directions (clockwise in FIG. 4 and counterclockwise in FIG. 5), the sample holding member 3 is displaced in the downward focus direction and the support members 12 contract in the focus direction.

The sample 2 held by the sample holding member 3 is displaced in the focus direction with the displacement of the sample holding member 3.

The directions of the polarities of the first magnets 14 and the second magnets 15 may be opposite to the directions in the foregoing example. If the directions of the polarities of the first magnets 14 and the second magnets 15 are opposite to the directions in the foregoing example, a relationship between the directions of the currents flowing in the first coil 17 and the second coil 18 and the directions of the displacement of the sample holding member 3 in the focus direction is opposite to the relationship in the forgoing example.

As described above, in the surface inspection device 1 according to the embodiment, the movable units are displaced in the focus direction by the currents flowing in the first coil 17 and the second coil 18 and the support members 12 contract in accordance with the displacement of the movable units. Therefore, the sample holding member 3 and the sample 2 can be driven in the focus direction by the sample drive unit 11. The sample holding member 3 and the sample 2 can be driven in the focus direction by the sample drive unit 11 while the spindle motor 4 is rotated. That is, in the surface inspection device 1 according to the embodiment, the sample holding member 3 and the sample 2 can be driven in the focus direction by the sample drive unit 11 while the spindle motor 4 is rotated.

When the plurality of support members 12 are not installed at positions at which a balance is achieved with respect to the sample holding member 3 or when mutual elastic forces are not balanced, the sample holding member 3 and the sample 2 are likely to be supported in a sloped state. Hereinafter, arrangement of the support members 12 and a slope of the sample holding member 3 with respect to deformation of the support members 12 (a slope in a direction perpendicular to the focus direction) will be described.

FIG. 6 is a top view illustrating arrangement of the support members 12 in the sample holding member 3 and the turntable 5. In FIG. 6, only the turntable 5, the support members 12, and the yoke 13 are illustrated so that the arrangement of the support members 12 is easily seen. FIG. 6 illustrates, for example, a case where the number of support members 12 is two.

Two support members 12 are arranged at an equal interval in the circumferential direction on the circumference equidistant from the central axis 20 of the sample holding member 3 with respect to the sample holding member 3 (and the turntable 5). Specifically, two support members 12 are arranged at positions (positions of which a central angle is 180 degrees) at which the circumference is bisected at positions on the circumference of a circle with a radius L having the central axis 20 as a center. More specifically, positions of connection portions of the two support members 12 with the sample holding member 3 are positions at which the circumference is bisected on the circumference of the circle with the radius L having the central axis 20 as a center.

The support members 12 are arranged at an equal interval in the circumferential direction on the circumference equidistant from the central axis 20 of the sample holding member 3, the positions of the connection portions of the support members 12 with the sample holding member 3 are symmetric with respect to the central axis 20, and thus an influence of a variation in the positions of the connection portions of the support members 12 with the sample holding member 3 can be made small.

The support members 12 are preferably installed at positions at which a distance L from the central axis 20 of the sample holding member 3 is half or more of the radius R of the sample holding member 3. More specifically, the support members 12 are preferably installed at positions at which the distance L from the central axis 20 of the sample holding member 3 to the positions of the connection portions of the support members 12 with the sample holding member 3 is half or more of the radius R of the sample holding member 3. When the support members 12 are installed at such positions (positions satisfying L≥R/2), there is the advantage of inhibiting slopes of the sample holding member 3 and the sample 2 when the sample holding member 3 is driven in the focus direction. Hereinafter, this will be described.

FIGS. 7A, 7B, and 7C are schematic views illustrating deformation of the support members 12 when the sample holding member 3 is driven in the focus direction and diagrams illustrating states in which the sample holding member 3 and the support members 12 are viewed in the Y direction. In FIGS. 7A, 7B, and 7C, for the simplification, a representative movable unit is the sample holding member 3 and a representative fixed unit is the turntable 5. FIG. 7A is a diagram illustrating a state in which the sample holding member 3 is not displaced. FIG. 7B a diagram illustrating a state in which the sample holding member 3 is displaced in the focus direction without being sloped with respect to a surface (XY plane) perpendicular to the focus direction. FIG. 7C is a diagram illustrating a state in which the sample holding member 3 is sloped with respect to the surface perpendicular to the focus direction and is displaced in the focus direction.

As illustrated in FIG. 7A, the support members 12 are configured with springs having a spring constant of k. FIG. 7A illustrates the distance L from the central axis 20 of the sample holding member 3 to the positions of the connection portions of the support members 12 with the sample holding member 3 on a plane of the sample holding member 3 and the radius R of the sample holding member 3.

As illustrated in FIG. 7B, F is an entire drive force applied in the focus direction to the representative movable unit which is the sample holding member 3, F/2 is a drive force applied to each support member 12, and $z_1$ is displacement of the movable unit in the focus direction. When m is a mass of the movable unit and $f_{z1}$ is a resonant frequency of a translation mode which is a mode in which the sample holding member 3 is moved in the focus direction without being sloped, the following expressions can be satisfied.

[Math. 1]
$$F = 2kz_1 \quad (1)$$

[Math. 2]
$$f_{z1} = \frac{1}{2\pi}\sqrt{\frac{2k}{m}} \quad (2)$$

FIG. 7C illustrates a case where a drive force applied to one support member 12 (12a) increases by ΔF and a drive force applied to the other support member 12 (12b) decreases by ΔF. Displacement of the support member 12a is $z_1+\Delta z_1$, displacement of the support member 12b is $z_1-\Delta z_1$, and a slope of the sample holding member 3 around the Y axis is θ1. When θ1 is minute, the following expression is satisfied.

[Math. 3]
$$\theta_1 = \frac{\Delta z_1}{L} \quad (3)$$

Rigidity $k_{\theta 1}$ of the support member 12 with respect to the slope of the sample holding member 3 satisfies the following expression.

[Math. 4]
$$k_{\theta 1} = 2kL^2 \quad (4)$$

When I is a moment of inertia of the movable unit around the Y axis and $f_{\theta 1}$ is a resonant frequency of a slope mode which is a mode in which the sample holding member 3 is sloped around the Y axis, the resonant frequency $f_{\theta 1}$ of the slope mode satisfies the following expression.

[Math. 5]
$$f_{\theta 1} = \frac{1}{2\pi}\sqrt{\frac{2kL^2}{I}} \quad (5)$$

The slope mode is a mode in which the sample holding member 3 is sloped with respect to a plane (horizontal surface) perpendicular to the focus direction.

When the sample holding member 3 is considered to be a thin circular plate, the moment of inertia I satisfies the following expression.

[Math. 6]
$$I = \frac{mR^2}{4} \quad (6)$$

From Expressions (2), (5), and (6), the following expression is obtained as an expression expressing the resonant frequency $f_{\theta 1}$ of the slope mode.

[Math. 7]
$$f_{\theta 1} = \frac{2L}{R}f_{z1} \quad (7)$$

From Expression (4), the rigidity $k_{\theta 1}$ of the support member 12 with respect to the slope of the sample holding member 3 is proportional to a square of the distance L from the central axis 20 of the sample holding member 3 to the positions of the connection portions of the support members 12 with the sample holding member 3. Accordingly, as the distance L is larger, that is, the positions at which the support members 12 are attached to the sample holding member 3 are on the outer circumferential side of the sample holding member 3, the rigidity $k_{\theta 1}$ of the support members 12 can be larger and the slope Gi of the sample holding member 3 can be smaller.

In particular, from Expression (7), by setting the distance L to be half or more of the radius R of the sample holding member 3, the resonant frequency $f_{\theta 1}$ of the slope mode can be set to be equal to or greater than the resonant frequency $f_{z1}$ of the translation mode (that is, when L≥R/2, $f_{\theta 1} \geq f_{z1}$ is satisfied). When the resonant frequency $f_{\theta 1}$ of the slope mode is set to be equal to or greater than the resonant frequency $f_{z1}$ of the translation mode and the sample holding member 3 is driven in the focus direction, it is possible to inhibit the slope of the sample holding member 3 occurring due to an influence of resonance of the slope mode.

The reasons will be described. In general, in a surface inspection device, the sample holding member 3 and the sample 2 are driven in the focus direction at a frequency equal to or less than the resonant frequency $f_{z1}$ of the translation mode. When the resonant frequency $f_{\theta 1}$ of the slope mode is less than the resonant frequency $f_{z1}$ of the translation mode, the resonant frequency $f_{\theta 1}$ of the slope mode becomes a value close to a frequency of driving of the sample holding member 3 in the focus direction, and thus the slope of the sample holding member 3 is likely to increase.

Accordingly, the distance L is set to be half or more of the radius R of the sample holding member 3 (L≥R/2), the rigidity $k_{\theta 1}$ of the support members 12 with respect to the slope of the sample holding member 3 is increased, and the resonant frequency $f_{\theta 1}$ is set to be equal to or greater than the resonant frequency $f_{z1}$ of the translation mode ($f_{\theta 1} \geq f_{z1}$). When $f_{\theta 1} \geq f_{z1}$ is set, the resonant frequency $f_{\theta 1}$ of the slope mode can be set to a value distant from a frequency of driving of the sample holding member 3 in the focus direction, and the slope of the sample holding member 3 can be inhibited.

In the surface inspection device 1 according to the embodiment, by setting $f_{\theta 1} \geq f_{z1}$ as L≥R/2, it is possible to inhibit the slope of the sample holding member 3 (the slope with respect to the horizontal direction) occurring due to an influence of resonance of the slope mode when the sample holding member 3 and the sample 2 are driven in the focus direction.

When an elastic modulus of the support members 12 is increased to improve the rigidity $k_{\theta 1}$ of the support members 12 with respect to the slope of the sample holding member 3, the rigidity in the focus direction is increased and a displacement amount of the sample holding member 3 in the focus direction is decreased. In the surface inspection device 1 according to the embodiment, when the support members 12 are installed at positions satisfying L≥R/2, magnitude of the rigidity in the focus direction can be inhibited and the rigidity $k_{\theta 1}$ with respect to the slope of the sample holding member 3 can be improved.

In the surface inspection device 1 according to the embodiment, the first magnets 14 and the second magnets 15 are preferably arranged to come into contact with each other in the focus direction. When only the first magnets 14 are installed in the yoke 13 or only the second magnets 15 are installed in the yoke 13, the magnets with the same direction of the polarity are arranged in the circumferential direction of the yoke 13, and are mutually repellent. Therefore, installation of the magnets in the yoke 13 becomes unstable. Accordingly, when the first magnets 14 and the second magnets 15 with mutually different directions of the polarity are arranged to come into contact with each other in the focus direction, a magnetic path is formed in the first magnets 14 and the second magnets 15. Therefore, the first magnets 14 and the second magnets 15 in the yoke 13 can be stably installed.

In the embodiment, the number of first magnets 14 and the number of second magnets 15 are each four, but the number of first magnets 14 and the number of second magnets 15 are not limited to four and any number can be used.

In the surface inspection device 1 according to the embodiment, in addition to the movement of the sample holding member 3 and the sample 2 in the focus direction by the vertical drive stage 7, the sample holding member 3 and the sample 2 can be driven in the focus direction by the sample drive unit 11 at a higher speed than in the movement in the focus direction by the vertical drive stage 7 while rotating the sample holding member 3 and the sample 2 about the Z axis by the spindle motor 4. In a surface inspection device of the related art, the sample holding member 3 and the sample 2 are moved in the focus direction by the vertical drive stage 7 at a speed lower than a rotation speed of the sample holding member 3. The surface inspection device 1 according to the embodiment further includes the plurality of support members 12 and the sample drive unit 11, can follow a variation in the position in the focus direction during rotation of the sample holding member 3, can drive the sample holding member 3 in the focus direction at a high speed accurately, and can adjust the height position of the surface of the sample 2.

In the surface inspection device 1 according to the embodiment, it is possible to reduce an influence of a variation in the positions of the connection portions of the support members 12 with the sample holding member 3, improve the rigidity of the support members 12 with respect to the slope of the sample holding member 3, an inhibit a variation in a drive force by the magnets since the first magnets 14 and the second magnets 15 are stably installed. Therefore, in the surface inspection device 1 according to the embodiment, it is possible to inhibit the influence of the slope of the sample holding member 3 and the sample 2 as small as possible, drive the sample holding member 3 in the focus direction accurately, and exactly inspect the sample 2.

Second Embodiment

A surface inspection device 1 according to a second embodiment of the present invention will be described. The surface inspection device 1 according to the embodiment is different from the surface inspection device 1 according to the first embodiment in the number and arrangement of support members 12 and is the same as the surface inspection device 1 according to the first embodiment in the other configurations. The surface inspection device 1 according to the embodiment includes three support members 12.

FIG. 8 is a diagram illustrating a sample drive unit 11, the plurality of support members 12, and peripheral constituent members (the sample holding member 3 holding the sample 2 and the spindle motor 4) of the surface inspection device 1 according to the embodiment. In FIG. 8, in order to facilitate the description, the frame 6, the vertical drive stage 7, the horizontal drive stage 8, and the coil fixing member 16 are not illustrated and the sample holding member 3 is illustrated to be separated from the sample drive unit 11.

FIG. 9 is a top view illustrating arrangement of the support members 12 in the sample holding member 3 and the turntable 5. In FIG. 9, only the turntable 5, the support members 12, and the yoke 13 are illustrated so that the arrangement of the support members 12 is easily seen. As described above, the number of support members 12 is three.

Three support members 12 are arranged at an equal interval in the circumferential direction on the circumference equidistant from the central axis 20 of the sample holding member 3. Specifically, the three support members 12 are arranged at positions (positions of which a central angle is 120 degrees) at which the circumference is trisected at positions on the circumference of a circle with a radius L having the central axis 20 as a center. More specifically, positions of connection portions of the three support members 12 with the sample holding member 3 are positions at which the circumference is trisected on the circumference of the circle with the radius L having the central axis 20 as a center.

FIGS. 10A, 10B, and 10C are schematic views illustrating deformation of the support members 12 when the sample holding member 3 is driven in the focus direction and diagrams illustrating states in which the sample holding member 3 and the support members 12 are viewed in the Y direction. In FIGS. 10A, 10B, and 10C, for the simplification, a representative movable unit is the sample holding member 3 and a representative fixed unit is the turntable 5. FIG. 10A is a diagram illustrating a state in which the sample holding member 3 is not displaced. FIG. 10B a diagram illustrating a state in which the sample holding member 3 is displaced in the focus direction without being sloped with respect to a surface (XY plane) perpendicular to the focus direction. FIG. 10C is a diagram illustrating a state in which the sample holding member 3 is sloped with respect to the surface perpendicular to the focus direction and is displaced in the focus direction.

As illustrated in FIG. 10A, the support members 12 are configured with springs having a spring constant of k. FIG. 10A illustrates a radius R of the sample holding member 3. The distance from the central axis 20 of the sample holding member 3 to the positions of the connection portions of the support members 12 with the sample holding member 3 on a plane of the sample holding member 3 is L the same as in the first embodiment (FIG. 9). In FIG. 10A, as the support members 12, support members 12c and 12d located at positions at which a distance from the central axis 20 of the sample holding member 3 is ($\sqrt{3}$)L/2 are illustrated when viewed on an XZ plane (when viewed in the Y direction of FIG. 9). In FIG. 10A, a support member 12e on the Y axis passing through the central axis 20 is illustrated as the support member 12.

As illustrated in FIG. 10B, F is an entire drive force applied in the focus direction to the representative movable unit which is the sample holding member 3, F/3 is a drive force applied to each support member 12, and $z_2$ is displacement of the movable unit in the focus direction. m is a mass of the movable unit and $f_{z2}$ is a resonant frequency of a translation mode which is a mode in which the sample holding member 3 operates in the focus direction without being sloped.

FIG. 10C illustrates a case where a drive force applied to one support member 12 (12c) increases by ΔF and a drive force applied to the other support member 12 (12d) decreases by ΔF. Displacement of the support member 12c is $z_2+\Delta z_2$, displacement of the support member 12d is $z_2-\Delta z_2$, and a slope of the sample holding member 3 around the Y axis is $\theta_2$ ($\theta_2$ is minute).

When a resonant frequency of a slope mode which is a mode in which the sample holding member 3 is sloped around the Y axis is $f_{\theta 2}$, the following expression is obtained as an expression indicating the resonant frequency $f_{\theta 2}$ of the slope mode by the expression development similar to that described in the first embodiment.

[Math. 8]

$$f_{\theta 2} = \frac{\sqrt{2}L}{R}f_{z2} \qquad (8)$$

From Expression (8), the distance L from the central axis 20 of the sample holding member 3 to the positions of the connection portions of the support member 12 with the sample holding member 3 is set to 1/($\sqrt{2}$) times or more, that is, 0.7 times or more the radius R of the sample holding member 3, and thus the resonant frequency $f_{\theta 2}$ of the slope mode can be set to be equal to or greater than the resonant frequency $f_{z2}$ of the translation mode (that is, when L≥R/($\sqrt{2}$), $f_{\theta 2} \geq f_{z2}$ is satisfied). When the resonant frequency $f_{\theta 2}$ of the slope mode can be set to be equal to or greater than the resonant frequency $f_{z2}$ of the translation mode and the sample holding member 3 is driven in the focus direction, it is possible to inhibit the slope of the sample holding member 3 occurring due to an influence of resonance of the slope mode.

Since the surface inspection device 1 according to the embodiment includes three support members 12, it is possible to inhibit the slope of the sample holding member 3 in the direction (the horizontal direction) perpendicular to the focus direction.

Third Embodiment

A surface inspection device 1 according to a third embodiment of the present invention will be described. The surface inspection device 1 according to the embodiment is different from the surface inspection device 1 according to the first embodiment in the number and arrangement of support members 12 and is the same as the surface inspection device 1 according to the first embodiment in the other configurations. The surface inspection device 1 according to the embodiment includes four support members 12.

FIG. 11 is a diagram illustrating a sample drive unit 11, the plurality of support members 12, and peripheral constituent members (the sample holding member 3 holding the sample 2 and the spindle motor 4) of the surface inspection device 1 according to the embodiment. In FIG. 11, to facilitate the description, the frame 6, the vertical drive stage 7, the horizontal drive stage 8, and the coil fixing member 16 are not illustrated and the sample holding member 3 is illustrated to be separated from the sample drive unit 11.

FIG. 12 is a top view illustrating arrangement of the support members 12 in the sample holding member 3 and the turntable 5. In FIG. 12, only the turntable 5, the support members 12, and the yoke 13 are illustrated so that the arrangement of the support members 12 is easily seen. As described above, the number of support members 12 is four.

Four support members 12 are arranged at an equal interval in the circumferential direction on the circumference equidistant from the central axis 20 of the sample holding member 3. Specifically, four support members 12 are arranged at positions (positions of which a central angle is 90 degrees) at which the circumference is quarter-sected at positions on the circumference of a circle with a radius L having the central axis 20 as a center. More specifically, positions of connection portions of the four support members 12 with the sample holding member 3 are positions at which the circumference is quarter-sected on the circumference of the circle with the radius L having the central axis 20 as a center.

FIGS. 13A, 13B, and 13C are schematic views illustrating deformation of the support members 12 when the sample holding member 3 is driven in the focus direction and diagrams illustrating states in which the sample holding member 3 and the support members 12 are viewed in the Y direction. In FIGS. 13A, 13B, and 13C, for the simplification, a representative movable unit is the sample holding member 3 and a representative fixed unit is the turntable 5. FIG. 13A is a diagram illustrating a state in which the sample holding member 3 is not displaced. FIG. 13B a diagram illustrating a state in which the sample holding member 3 is displaced in the focus direction without being sloped with respect to a surface (XY plane) perpendicular to the focus direction. FIG. 13C is a diagram illustrating a state in which the sample holding member 3 is sloped with respect to the surface perpendicular to the focus direction and is displaced in the focus direction.

As illustrated in FIG. 13A, the support members 12 are configured with springs having a spring constant of k. FIG. 13A illustrates the distance L from the central axis 20 of the sample holding member 3 to the positions of the connection portions of the support members 12 with the sample holding member 3 on a plane of the sample holding member 3 and the radius R of the sample holding member 3. In FIG. 13A, spring moduli of two support members 12 (12*f* and 12*g*) on the Y axis passing through the central axis 20 are combined as 2k.

As illustrated in FIG. 13B, F is an entire drive force applied in the focus direction to the representative movable unit which is the sample holding member 3, F/4 is a drive force applied to each support member 12, and $z_3$ is displacement of the movable unit in the focus direction. m is a mass of the movable unit and $f_{z3}$ is a resonant frequency of a translation mode which is a mode in which the sample holding member 3 operates in the focus direction without being sloped. In FIG. 13B, drive forces applied to the two support members 12 (12*f* and 12*g*) on the Y axis passing through the central axis 20 are combined as F/2.

FIG. 13C illustrates a case where a drive force applied to one support member 12 (12*h*) increases by ΔF and a drive force applied to the other support member 12 (12*i*) decreases by ΔF. Displacement of the support member 12*h* is $z_3+\Delta z_3$, displacement of the support member 12*i* is $z_3-\Delta z_3$, and a slope of the sample holding member 3 around the Y axis is $\theta_3$ ($\theta_3$ is minute).

When a resonant frequency of a slope mode which is a mode in which the sample holding member 3 is sloped around the Y axis is $f_{\theta 3}$, the following expression is obtained as an expression indicating the resonant frequency $f_{\theta 3}$ of the slope mode by the expression development similar to that described in the first embodiment.

[Math. 9]

$$f_{\theta 3} = \frac{\sqrt{2}L}{R} f_{z3} \quad (9)$$

From Expression (9), the distance L from the central axis 20 of the sample holding member 3 to the positions of the connection portions of the support member 12 with the sample holding member 3 is set to $1/(\sqrt{2})$ times or more, that is, 0.7 times or more the radius R of the sample holding member 3, and thus the resonant frequency $f_{\theta 3}$ of the slope mode can be set to be equal to or greater than the resonant frequency $f_{z3}$ of the translation mode (that is, when $L \geq R/(\sqrt{2})$, $f_{\theta 3} \geq f_{z3}$ is satisfied). When the resonant frequency $f_{\theta 3}$ of the slope mode can be set to be equal to or greater than the resonant frequency $f_{z3}$ of the translation mode and the sample holding member 3 is driven in the focus direction, it is possible to inhibit the slope of the sample holding member 3 occurring due to an influence of resonance of the slope mode.

When the number of support members 12 is five or more, a relationship between the resonant frequency of the slope mode and the resonant frequency of the translation mode is indicated in Expression (9) by the expression development similar to that described in the first embodiment.

Accordingly, when the number of support members 12 is three or more in consideration of the second embodiment (Expression (8)), the distance L from the central axis 20 of the sample holding member 3 to the positions of the connection portions of the support member 12 with the sample holding member 3 is set to $1/(\sqrt{2})$ times or more, that is, 0.7 times or more the radius R of the sample holding member 3, and thus the resonant frequency of the slope mode can be set to be equal to or greater than the resonant frequency of the translation mode. When the sample holding member 3 is driven in the focus direction, it is possible to inhibit the slope of the sample holding member 3 occurring due to the influence of the resonance of the slope mode.

Fourth Embodiment

A surface inspection device 1 according to a fourth embodiment of the present invention will be described. The surface inspection device 1 according to the embodiment is different from the surface inspection device 1 according to the first to third embodiments in the shapes of the yoke 13, the first magnets 14 and the second magnets 15 and is the same as the surface inspection device 1 according to the first to third embodiments in the other configurations. In the surface inspection device 1 according to the embodiment, the yoke 13 includes a rectangular cylindrical portion of which transverse section is polygonal.

FIG. 14 is a diagram illustrating a sample drive unit 11 and peripheral constituent members (the sample holding member 3 holding the sample 2 and the spindle motor 4) of the surface inspection device 1 according to the embodiment. In FIG. 14, to facilitate the description, the frame 6, the vertical drive stage 7, the horizontal drive stage 8, and the coil fixing member 16 are not illustrated.

The yoke 13 include a rectangular cylindrical portion of which a transverse section is polygonal and which has the focus direction (the Z direction) as a central axis, and the sample holding member 3 is provided above. The rectangular cylindrical portion has at least polygonal outer circumference, and the first magnets 14 and the second magnets 15 are fixed to the polygonal portion.

The plurality of first magnets 14 are provided at any interval at the first height position in the focus direction on the outer surface of the rectangular cylindrical portion of the yoke 13. The plurality of second magnets 15 are provided at any interval at the second height position in the focus direction on the outer surface of the rectangular cylindrical portion of the yoke 13.

The support members 12 may have any configuration among the configurations described in the first to third embodiments.

FIG. 15 is a diagram illustrating arrangement of the first magnets 14 and the first coil 17 provided in the yoke 13. FIG. 15 illustrates a cross-section (the XY plane) of the sample drive unit 11 perpendicular to the focus direction at the height position at which the first magnets 14 are provided (a first height position in the focus direction).

FIG. 16 is a diagram illustrating arrangement of the second magnets 15 and the second coil 18 provided in the yoke 13. FIG. 16 illustrates a cross-section (the XY plane) of the sample drive unit 11 perpendicular to the focus direction at the height position at which the second magnets 15 are provided (a second height position in the focus direction).

The first magnets 14 and the second magnets 15 are rectangular parallelepiped and are provided on the outer surface (plane portion) of the rectangular cylindrical portion of the yoke 13. The first magnets 14 are magnetized in a direction perpendicular to the surface coming into contact with the yoke 13 and have a first polarity (the N pole in the embodiment) on an opposite surface to the surface coming into contact with the yoke 13 and a second polarity (the S pole in the embodiment) on the surface coming into contact with the yoke 13. The second magnets 15 are magnetized in a direction perpendicular to the surface coming into contact with the yoke 13 and have a second polarity (the S pole in the embodiment) on an opposite surface to the surface coming into contact with the yoke 13 and a first polarity (the N pole in the embodiment) on the surface coming into contact with the yoke 13. That is, the second magnets 15 have a direction of the polarity opposite to the first magnets 14.

The principle that the sample holding member 3 is displaced in the focus direction and the sample 2 held by the sample holding member 3 is displaced in the focus direction is the same as that described in the first embodiment. That is, as illustrated in FIG. 15, when a current flows in the first coil 17 counterclockwise when viewed from the upper side in the focus direction, the first magnets 14 are displaced in the upward focus direction. As illustrated in FIG. 16, when a current flows in the second coil 18 clockwise when viewed from the upper side in the focus direction, the second magnets 15 are displaced in the upward focus direction. When the first magnets 14 and the second magnets 15 are displaced in the upward focus direction, the sample holding member 3 is displaced in the upward focus direction.

When the directions of the currents flowing in the first coil 17 and the second coil 18 are set to be opposite to that described in the above (clockwise in FIG. 15 and counterclockwise in FIG. 16), the sample holding member 3 is displaced in the downward focus direction.

In the surface inspection device 1 according to the embodiment, the first magnets 14 and the second magnets 15 are preferably arranged to be close to each other in the focus direction. When the first magnets 14 and the second magnets 15 with different directions of the polarities are arranged in this manner, a magnetic path is formed in the first magnets 14 and the second magnets 15. Therefore, the first magnets 14 and the second magnets 15 in the yoke 13 can be stably installed.

In the surface inspection device 1 according to the embodiment, the first magnets 14 and the second magnets 15 are rectangular parallelepiped. Therefore, the first magnets 14 and the second magnets 15 according to the embodiment are magnetized more easily than the first magnets 14 and the second magnets 15 having an arc shape in the first embodiment. Further, by setting the directions of the polarities to be opposite to each other in the first magnets 14 and the second magnets 15 according to the embodiment when installed in the yoke 13, it is possible to use the same components, reduce types of components, and reduce cost.

In the embodiment, the case where the number of first magnets 14 and the number of second magnets 15 are each eight has been described, but the number of first magnets 14 and the number of second magnets 15 are not limited to eight and any number can be determined.

Fifth Embodiment

A surface inspection device 1 according to a fifth embodiment of the present invention will be described. The surface inspection device 1 according to the embodiment is different from the surface inspection device 1 according to the first to fourth embodiments in the shape of the yoke 13 and is the same as the surface inspection device 1 according to the first to fourth embodiments in the other configurations. In the surface inspection device 1 according to the embodiment, a plurality of protrusions along the circumferential direction are provided on the outer surface of the yoke 13.

Hereinafter, differences of the surface inspection device 1 according to the embodiment from the surface inspection device 1 according to the first embodiment will be mainly described.

FIG. 17 is a diagram illustrating a sample drive unit 11 and peripheral constituent members (the sample holding member 3 holding the sample 2 and the spindle motor 4) of the surface inspection device 1 according to the embodiment. In FIG. 17, to facilitate the description, the frame 6, the vertical drive stage 7, the horizontal drive stage 8, the coil fixing member 16, the first coil 17, and the second coil 18 are not illustrated.

FIG. 18 is a diagram illustrating arrangement of the first magnets 14 provided in the yoke 13. FIG. 18 illustrates a cross-section (the XY plane) of the sample drive unit 11 perpendicular to the focus direction at the height position at which the first magnets 14 are provided (a first height position in the focus direction).

The yoke 13 includes a plurality of protrusions 13a in the circumferential direction on the outer surface and depressions are formed between the plurality of protrusions 13a. The first magnets 14 and the second magnets 15 are fixed to the depressions of the yoke 13. That is, the first magnets 14 and the second magnets 15 are fixed in the depressions of the outer surface of the yoke 13 between the plurality of protrusions 13a.

In the surface inspection device 1 according to the first to fourth embodiments, there are a plurality of gaps in the circumferential direction between the plurality of first magnets 14 and between the plurality of second magnets 15. When the movable units (the first magnets 14, the second magnets 15, the yoke 13, and the sample holding member 3) are rotated by the spindle motor 4, air flows around the movable units are dispersed, and thus vibration or noise is likely to occur due to the gaps.

In the surface inspection device 1 according to the embodiment, the yoke 13 has the protrusions 13a on the outer surface, and the protrusions 13a fill the gaps between the first magnets 14 and the gaps between the second magnets 15. Thus, dispersion of air flows during rotation of the movable units can be inhibited, and thus vibration or noise can be reduced. In the surface inspection device 1 according to the embodiment, by inhibiting the dispersion of the air flows during rotation of the movable units and reducing the vibration, it is possible to drive the sample holding member 3 in the focus direction accurately, and thus it is possible to inspect the sample 2 more accurately.

Sixth Embodiment

A surface inspection device 1 according to a sixth embodiment of the present invention will be described. The surface inspection device 1 according to the embodiment is different from the surface inspection device 1 according to the first to fifth embodiments in the positions of the first magnets 14 and the second magnets 15 and the shape of the yoke 13 and is substantially the same as the surface inspection device 1 according to the first to fifth embodiments in the other configurations. In the surface inspection device 1 according to the embodiment, the first magnets 14 and the second magnets 15 are fixed to the inner surface of the yoke 13 and the yoke 13 has the plurality of protrusions along the circumferential direction on the inner surface. Hereinafter, differences of the surface inspection device 1 according to the embodiment from the surface inspection device 1 according to the first embodiment will be mainly described.

FIG. 19 is an exploded perspective view illustrating a configuration of the sample drive unit 11 of the surface inspection device 1 according to the present embodiment.

FIG. 20 is a diagram illustrating an arrangement of the first magnets 14 provided in the yoke 13. FIG. 20 illustrates a cross-section (the XY plane) of the sample drive unit 11 perpendicular to the focus direction at the height position at which the first magnets 14 are provided (a first height position in the focus direction).

In the first to fifth embodiments, the surface inspection device 1 includes the first magnets 14 and the second magnets 15 on the outer surface of the yoke 13.

The surface inspection device 1 according to the embodiment includes the first magnets 14 and the second magnets 15 on the inner surface of the yoke 13.

As illustrated in FIGS. 19 and 20, the plurality of first magnets 14 are provided at the first height position in the focus direction on the inner surface of the cylindrical portion of the yoke 13. The plurality of first magnets 14 are fixed to the yoke 13 at any interval in the circumferential direction of the yoke 13. The plurality of second magnets 15 are provided at the second height position in the focus direction on the inner surface of the cylindrical portion of the yoke 13. The plurality of second magnets 15 are fixed to the yoke 13 at any interval in the circumferential direction of the yoke 13.

As illustrated in FIG. 20, the yoke 13 includes a plurality of protrusions 13b in the circumferential direction on the inner surface and depressions are formed between the plurality of protrusions 13b. The first magnets 13 and the second magnets 15 are fixed to the depressions of the yoke 13. That is, the first magnets 14 and the second magnets 15 are fixed to the depressions of the inner surface of the yoke 13 between the plurality of protrusions 13b. The yoke 13 may not include the protrusions 13b.

The first coil 17 has an annular shape, is disposed around the first magnets 14, and is interposed between the first magnets 14 and the yoke 13. The second coil 18 has an annular shape, is disposed around the second magnets 15, and is interposed between the second magnets 15 and the yoke 13.

As illustrated in FIGS. 19 and 20, the first magnets 14 have the first polarity (the N pole in the embodiment) on a surface opposite to a surface coming into contact with the yoke 13 and have the second polarity (the S pole in the embodiment) on the surface coming into contact with the yoke 13. The second magnets 15 have the second polarity (the S pole in the embodiment) on a surface opposite to a surface coming into contact with the yoke 13 and have the first polarity (the N pole in the embodiment) on the surface coming into contact with the yoke 13.

The surface inspection device 1 according to the embodiment includes the first magnets 14 and the second magnets 15 on the inner surface of the cylindrical portion of the yoke 13. Accordingly, when the movable units (the first magnets 14, the second magnets 15, the yoke 13, and the sample holding member 3) are rotated by the spindle motor 4, a centrifugal force applied to the first magnets 14 and the second magnets 15 is applied in a direction in which the yoke 13 is pressed by the first magnets 14 and the second magnets 15. Therefore, the first magnets 14 and the second magnets 15 are stably and rigidly fixed to the yoke 13.

In the surface inspection device 1 according to the embodiment, stability of the installation of the first magnets 14 and the second magnets 15 is good. Therefore, it is possible to inhibit a variation in a drive force by the magnet, it is possible to drive the sample holding member 3 in the focus direction accurately, and inspect the sample 2 more accurately.

In the embodiment, as in the first embodiment, the configuration in which the yoke 13 includes a cylindrical portion on the inner surface and the first magnets 14 and the second magnets 15 have the arc shape has been described. However, in the surface inspection device 1 according to the embodiment, the yoke 13 may include a rectangular cylindrical portion on the inner surface and the first magnets 14 and the second magnets 15 may have a rectangular parallelepiped shape.

The present invention is not limited to the foregoing embodiments, and various modifications can be made. For example, the foregoing embodiments have been described in detail to facilitate the description of the present invention and the present invention is not necessarily limited to all the described configurations.

A part of a configuration according to a certain embodiment can be replaced with a configuration according to another embodiment. A configuration according to another embodiment can also be added to a configuration according to a certain embodiment. Further, it is possible to delete a part of the configuration of each embodiment, add another configuration, or replace the part of the configuration with another configuration.

REFERENCE SIGNS LIST

1: surface inspection device
2: sample
3: sample holding member
4: spindle motor
5: turntable
6: frame
7: vertical drive stage
8: horizontal drive stage
9: illumination optical system
10: detection optical system
11: sample drive unit
12, 12a, 12b, 12c, 12d, 12e, 12f, 12g, 12h, 12i support member
13: yoke
13a, 13b: protrusion
14: first magnet 15: second magnet
16: coil fixing member
17: first coil
18: second coil
20: central axis

The invention claimed is:

1. A surface inspection device comprising:
a plate-shaped sample holding member capable of holding a sample;
a spindle motor configured to rotate the sample holding member;
a turntable fixed to the spindle motor and configured to rotate by an operation of the spindle motor;
a frame to which the spindle motor is fixed;
a plurality of support members each having one end fixed to the sample holding member and the other end fixed to the turntable, the support members configured to support the sample holding member such that the sample holding member is displaceable in a focus direction that is a height direction with respect to the turntable; and
a sample drive unit configured to displace the sample holding member in the focus direction with respect to the turntable.

2. The surface inspection device according to claim 1, wherein the support members are configured with elastic members and expand and contract when the sample drive unit displaces the sample holding member in the focus direction.

3. The surface inspection device according to claim 2,
wherein the sample holding member is a circular plate and has a central axis that is a rotation axis for the spindle motor, and
wherein the support members are arranged at an equal interval in a circumferential direction on a circumstance equidistant from the central axis of the sample holding member with respect to the sample holding member.

4. The surface inspection device according to claim 3, wherein the support members are installed at positions at which distances from the central axis of the sample holding member are half or more of a radius of the sample holding member with respect to the sample holding member.

5. The surface inspection device according to claim 3,
wherein the number of support members is three or more, and
wherein the support members are installed at positions at which distances from the central axis of the sample holding member are $1/(\sqrt{2})$ times or more a radius of the sample holding member with respect to the sample holding member.

6. The surface inspection device according to claim 3, wherein a resonant frequency of a slope mode that is a mode in which the sample holding member is sloped with respect to a surface perpendicular to the focus direction is equal to or greater than a resonant frequency of a translation mode in which the sample holding member is moved in the focus direction.

7. The surface inspection device according to claim 2,
wherein the sample drive unit includes
a yoke to which the sample holding member is fixed above,
a plurality of first magnets fixed to a surface of the yoke and provided at a first height position,
a plurality of second magnets fixed to the surface of the yoke and provided at a second height position in which a position of the focus direction is different from the first height position,
a first coil disposed around the plurality of first magnets, and
a second coil disposed around the plurality of second magnets,
wherein a surface of the second magnet coming into contact with the yoke has a first polarity,
wherein a surface of the first magnet coming into contact with the yoke has a second polarity, and
wherein the first magnet and the second magnet come into contact with each other in the focus direction.

8. The surface inspection device according to claim 7,
wherein the yoke includes a cylindrical portion that has the focus direction as a central axis,
wherein the first magnet and the second magnet are fixed to an outer surface of the cylindrical portion of the yoke.

9. The surface inspection device according to claim 7,
wherein the yoke includes a cylindrical portion that has the focus direction as a central axis,
wherein the first magnet and the second magnet are fixed to an inner surface of the cylindrical portion of the yoke.

10. The surface inspection device according to claim 7,
wherein the yoke includes rectangular cylindrical portion that has the focus direction as a central axis,
wherein the first magnet and the second magnet are fixed to an outer surface of the rectangular cylindrical portion of the yoke.

11. The surface inspection device according to claim 7,
wherein the yoke includes rectangular cylindrical portion that has the focus direction as a central axis,
wherein the first magnet and the second magnet are fixed to an inner surface of the rectangular cylindrical portion of the yoke.

12. The surface inspection device according to claim 7,
wherein a plurality of protrusions are provided on the surface of the yoke, and
wherein the plurality of first magnets and the plurality of second magnets are fixed between the plurality of protrusions.

13. The surface inspection device according to claim 7, wherein a current in an opposite direction to a current flowing in the second coil when viewed in the focus direction flows in the first coil.

\* \* \* \* \*